(12) United States Patent
Schaefer

(10) Patent No.: US 8,037,375 B2
(45) Date of Patent: Oct. 11, 2011

(54) FAST DATA EYE RETRAINING FOR A MEMORY

(75) Inventor: Andre Schaefer, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 12/459,420

(22) Filed: Jun. 30, 2009

(65) Prior Publication Data

US 2010/0332921 A1 Dec. 30, 2010

(51) Int. Cl.
*G06F 11/00* (2006.01)

(52) U.S. Cl. ............... 714/707; 714/5; 714/25; 714/36; 714/42; 714/43; 714/47; 714/55; 714/56; 714/700; 714/702; 714/709; 714/712; 714/713; 714/718; 714/719; 714/731; 714/739; 714/744; 714/745; 714/798; 702/85; 702/94; 702/106; 365/200; 365/201

(58) Field of Classification Search .................. None
See application file for complete search history.

(56) References Cited

U.S. PATENT DOCUMENTS

| 6,691,214 | B1 |  | 2/2004 | Li et al. | |
| 7,461,286 | B2 | * | 12/2008 | James | 713/503 |
| 7,743,288 | B1 | * | 6/2010 | Wang | 714/704 |
| 7,853,837 | B2 | * | 12/2010 | Perego et al. | 714/704 |
| 2003/0117864 | A1 | * | 6/2003 | Hampel et al. | 365/200 |
| 2004/0123207 | A1 | * | 6/2004 | Zumkehr et al. | 714/744 |
| 2007/0074084 | A1 | * | 3/2007 | Mobin et al. | 714/700 |

FOREIGN PATENT DOCUMENTS

DE 10 2007 036 648 A1 2/2008

OTHER PUBLICATIONS

"Qimonda GDDR5—White Paper", Aug. 2007, 10 pgs.*

* cited by examiner

*Primary Examiner* — John Trimmings
(74) *Attorney, Agent, or Firm* — Derek J. Reynolds

(57) ABSTRACT

A method, device, and system are disclosed. In one embodiment method includes determining a left edge and right edge of a valid data eye for a memory. The method continues by periodically checking the left and right edges for movement during operation of the memory. If movement is detected, the method retrains the valid data eye with an updated left edge and right edge.

14 Claims, 7 Drawing Sheets

| 0 | 1 | 2 | 3 | 4 | 5 | 6 | 7 |
|---|---|---|---|---|---|---|---|
|   |   |   |   | DQ0 |   |   |   |
|   |   |   |   | DQ1 |   |   |   |
|   |   |   |   | DQ2 |   |   |   |
|   |   |   |   | DQ3 |   |   |   |
|   |   |   |   | DQ4 |   |   |   |
|   |   |   |   | DQ5 |   |   |   |
|   |   |   |   | DQ6 |   |   |   |
|   |   |   |   | DQ7 |   |   |   |
|   |   |   |   | DBI |   |   |   |
|   |   |   |   |   |   |   |   |
|   |   |   |   | EDC |   |   |   |
|   |   |   |   |   |   |   |   |

FIG. 2

FAST DATA EYE RETRAINING FOR A MEMORY

FIELD OF THE INVENTION

The invention is related to retraining a data eye for a memory dynamically several times during operation of the memory.

BACKGROUND OF THE INVENTION

Memory subsystems that utilize memories such as double data rate (DDR) synchronous dynamic random access memory (SDRAM) has a source synchronous interface that requires precise timing. The timing on the interconnect coupling the memory to a controller is edge aligned for the data and the strobe signals. The strobe signal is generally delayed to the center of the data and utilized to latch the data. The range timing from the beginning to the end of valid data is referred to as the valid data eye. The eye is defined by two edges, between the two edges the data may be correctly latched, outside of the two edges the data becomes invalid. Thus, the strobe must fall between the edges of the data eye to obtain correct data. As the speed of memory increases, not only does the eye become narrower, but other conditions related to memory operation can cause the eye to drift. For example, thermal conditions may cause the eye to drift. Thermal conditions of the memory devices may change based on power consumption changes from different workloads (i.e. as data throughput across the memory channel increases, power consumption may increase for the memory devices, which would lead to a higher thermal load per device). The latest versions of memory continue to increase in speed, such as DDR2, DDR3, DDR4, DDR5 is not yet defined or in definition process, refer to it as future DDR standard? and graphics memory implementations (e.g. GDDR5), among others.

BRIEF DESCRIPTION OF THE DRAWINGS

The present invention is illustrated by way of example and is not limited by the drawings, in which like references indicate similar elements, and in which:

FIG. 2 illustrates an embodiment of information transferred across the memory interconnect.

DETAILED DESCRIPTION OF THE INVENTION

Embodiments of a method, device, and system for fast memory data eye retraining are disclosed.

In the following description and claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

Figure 1:
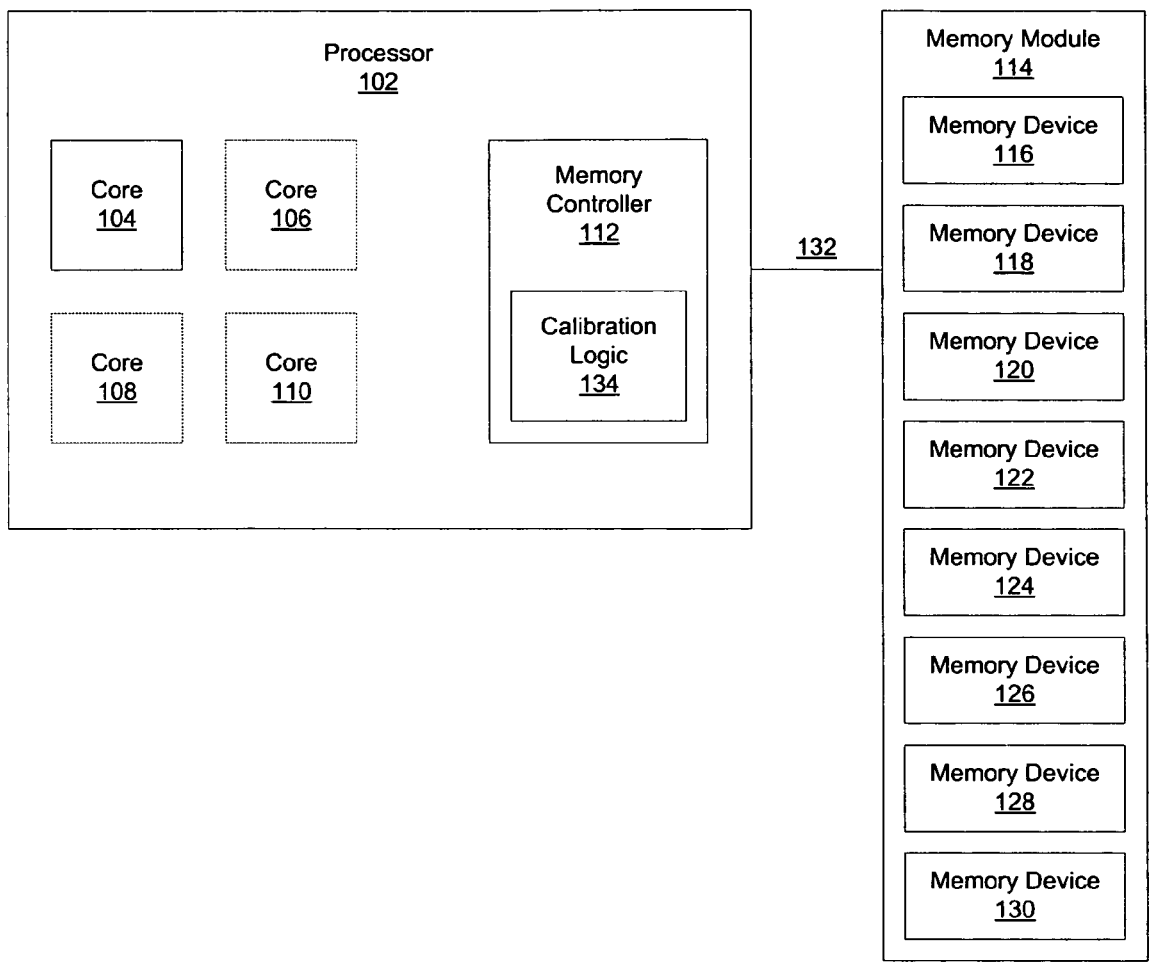
FIG. 1 illustrates an embodiment of a device and system for fast memory data eye retraining.

FIG. 1 illustrates an embodiment of a device and system for fast memory data eye retraining. In many embodiments a computer system 100 may include a processor 102, such as a central processing unit (CPU) and/or a graphics processing unit (GPU). In other embodiments that are not shown, the computer system 100 may include two or more processors. Processor 102 may be an Intel®-based central processing unit (CPU), graphics processing unit (GPU), a combination of a CPU and GPU, or another brand CPU or GPU. In different embodiments, processor 102 may have one or more cores. For example, FIG. 1 shows processor 102 with four cores 104, 106, 108, and 110. In other embodiments that are not shown, processor 102 may have 1, 2, 8, 16, or more cores.

Each processor core may include several internal operational units such as execution units and instruction retirement units. Also, each core may also include several internal memory locations utilized to store data, such as registers and caches. For example, in an Intel®-based microprocessor architecture, each core may include a first level cache (L1), one or more Control Registers, one or more Model Specific Registers, an instruction pointer (EIP) register, etc. This internal circuitry to each core is not shown in FIG. 1.

In many embodiments, processor 102 is coupled to a memory subsystem through memory controller 112. Although FIG. 1 shows memory controller 112 integrated into processor 102, in other embodiments that are not shown, the memory controller may be integrated into a bridge device or other integrated circuit in the computer system that is discrete from processor 102. The memory controller may include one or more read and write FIFO (first-in first-out) buffers to store data to be written to or read from memory. The memory subsystem includes system memory module 114 to store instructions to be executed by the processor. The memory devices, for example devices 116-130 in memory module 114 may be any type of volatile dynamic random access memory (DRAM). For example, the memory may be a more recent version of double data rate (DDR) synchronous DRAM, such as GDDR5. Though, in different embodiments, the memory devices may be any type of memory that has performance substantial enough to potentially cause thermal drift to the data eye. In other embodiments that are not shown there may be more or less memory devices on memory module 114 as well as additional memory modules coupled to processor 102.

The processor 102 is coupled to the memory by a processor-memory interface, which may be interconnect 132 (i.e. a link/bus) that includes individual lines that can transmit data, address, control, and other information between the processor and the memory. In many embodiments, link 132 transfers a double quadword (64-bits) of data at a time as well as potential error detecting code (EDC) information and data bus inversion (DBI) information.

FIG. 2 illustrates an embodiment of information transferred across the memory interconnect. In many embodiments, the interconnect comprises eight separate byte lanes (DQ0-DQ7). Each byte lane transfers a byte of information and the eight lanes together comprise a single double-quadword of information. Double quadwords 0-7 are shown across the top of the lane chart where byte lanes DQ0-DQ7 are each utilized to carry one of the eight bytes of the double quadword. For each transferred double quadword, each byte lane has a window of time where the transferred byte of data is valid on the interconnect and can be latched. In different embodiments, the latching mechanism may be a strobe signal, an external clock signal, or an internal clock signal. The latching mechanism may be unique for each byte lane. One additional byte lane is utilized for DBI information. DBI information tells a component when latching data whether the string of bits in each byte lane is inverted or the actual information. This allows, per byte across DQ0-7, at least 50% of the lanes to be driven to high voltage for any given piece of data. Lastly, there is also EDC information associated with each double quadword to allow error checking and correcting circuitry to determine whether the latched data is correct or contains one or more errors.

On occasion, such as when the computer system (100 in FIG. 1) initially powers up, it is necessary to train the memory. Training the memory comprises determining, per byte lane, a window of time when the data is valid on the interconnect. This window of time can vary based on a number of factors. Thus, training occurs to verify the edges of the window (referred to as a data eye). Once the left and right edges (i.e. leading and trailing edges on a time line) of the data eye are determined, logic can set the data strobe (external or internal clock) up to be edge aligned to the very center of the eye. This allows data to be latched at the safest location, halfway between the leading and trailing edges of the valid data eye. In the best possible scenario, the edge of the strobe always splits the difference between the left and right edges of the valid data eye, though this is not always the case. In many embodiments, due to a number of factors, the left and right edges of the valid data eye may drift. For example, with very fast memory, the transistors in the memory may cause an increased thermal load per memory device which may cause a thermal drift of the eye or the eye can shift because of externally induced temperature change caused by heat dissipation of adjacent chips, Generally when the memory is originally trained, training sequences are sent at every potential incremental timing location across the eye as well as beyond both the left and right edges. This set of training sequences for the full valid data eye can take significant time. For example, the method utilized in GDDR5 memories includes sending a sequence of a write training command (WRTR) each followed by a read training command (RDTR), repeated several times per incremental location along the eye. These commands are explained in detail in the respective JEDEC (Joint Electron Device Engineering Council) specifications per memory type. GDDR5 memory has a draft specification (Version 3 (Item Number 1733.46)) for download that contains detailed information on the WRTR and RDTR sequences.

Generally speaking, the training occurs once initially during system power up which determines the valid data eye edges and the location to set the data strobe at to center-align within the eye. In many embodiments, calibration logic (134 in FIG. 1) issues commands for read and write training. In some embodiments calibration logic is located within the memory controller (112 in FIG. 1). In other embodiments, calibration logic is located in a discrete location from the memory controller.

An issue may arise when the edges of the eye drift during operation from the initial determined edge locations. To rebalance the data strobe in the middle of the eye, normally a full retraining scan of all increments through the eye (and several outlying timing increments external to the eye edges) would take place. To alleviate this time-consuming set of training operations to compensate for eye drift, in many embodiments a fast retraining process is defined.

Retraining speed may increase based on several factors. For example, for a given timing increment, the retraining process may be modified to first send out a WRTR command as normal, but instead of waiting for completion and then sending out a RDTR command, the read training may be accomplished by viewing the EDC that returns immediately for the WRTR command. If the WRTR command returns with a valid position within the eye, the process may confirm that writes are being latched within the valid data eye at the incremental timing position tested. Then for read training, if there are no errors found in the returned EDC (the EDC for the RDTR command), then the latched read can be assumed to be a good position within the valid data eye at the incremental timing position. Thus, instead of waiting for a full RDTR command sequence, calibration logic performing the training may assume a valid eye location for a read when it determines no errors are found in the EDC.

Additionally, in many embodiments, read retraining operates in a similar manner as write retraining but uses a RDTR command, With read retraining, in some embodiments the memory read FIFO may be loaded with data as a precondition for the training. In other embodiments, the read training utilizes the random data already in the memory read FIFO as a precondition. The EDC and the data are required to match.

Additionally, while the initial training sequence may be performed during computer system power up for the set of incremental timing locations across the entire eye, this full spectrum of timing locations need not be tested for retraining purposes during operation. Rather, once the valid left and right edges of the valid data eye are known, for retraining purposes, only a small subset of locations in the vicinity of each edge may need testing during operation to check for drift.

FIGS. 3A-3D illustrate an embodiment of a process to search for the left edge of the valid data eye during operation.

Figure 3A:
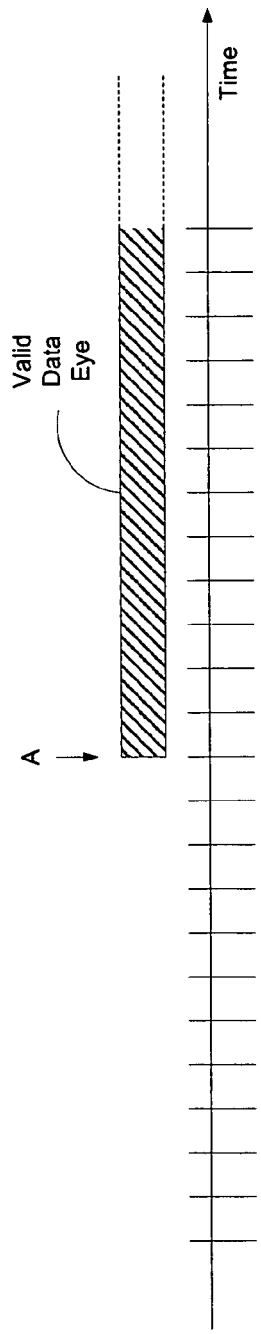
FIGS. 3A-3D illustrate an embodiment of a process to search for the left edge of the valid data eye during operation.

FIG. 3A shows the left edge of a valid data eye along a relative time line where each tick on the timeline accounts for the smallest potential incremental change for data eye edge testing (as well as data strobe positioning, external or internal clocks). In FIG. 3A, the initial data eye training sequence to find the left and right edges of the eye has been completed and calibration logic has determined that position A is the current left edge. In other words, position A is the further left position within the eye where valid data is returned upon issuing a WRTR and/or RDTR (or other read training-type) command. Thus, the next increment to the left of left edge position A in FIG. 3A would return invalid data.

Figure 3B:
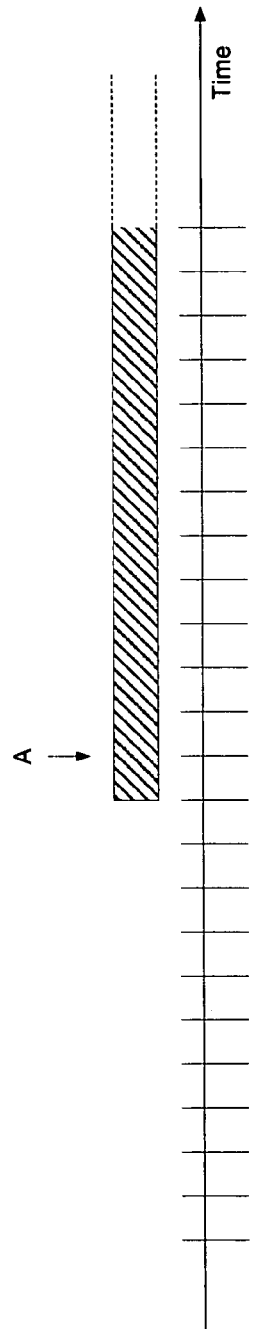

FIG. 3B shows that after a period of operational time, the edge of the valid data eye has moved one increment to the left. Thus, at this point position A is no longer the current left edge of the valid data eye.

Figure 3C:
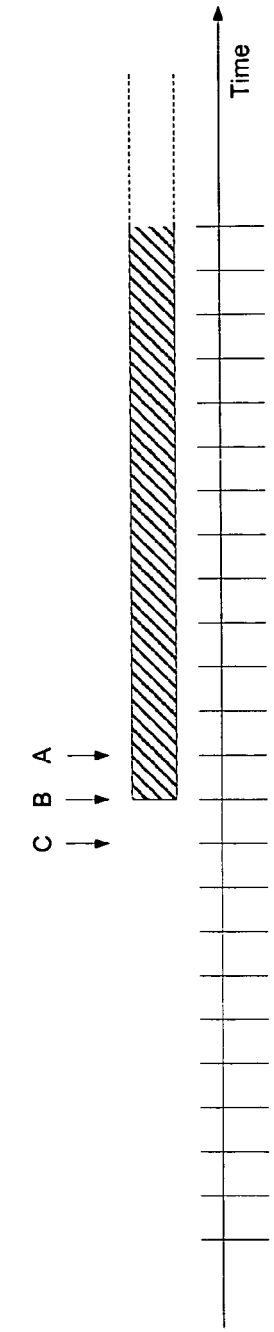

FIG. 3C shows training sequences issued for positions B and C to determine a new left edge location. There are many different embodiments for a search algorithm to search for and determine the new (i.e. updated) edge of the eye. For example, in one embodiment, the previous edge location is determined and if that location is currently valid, the algorithm may step further left (for a left edge location) or further right (for a right edge location) to determine the updated edge location. In this embodiment, once the first incremental location that produces invalid data is found, the algorithm may determine that the previous location (i.e. the last good data location) is the current valid edge. In other embodiments, a predetermined number of timing increments to the left and right of the previous edge may be tested each time a retraining sequence is performed.

Figure 3D:
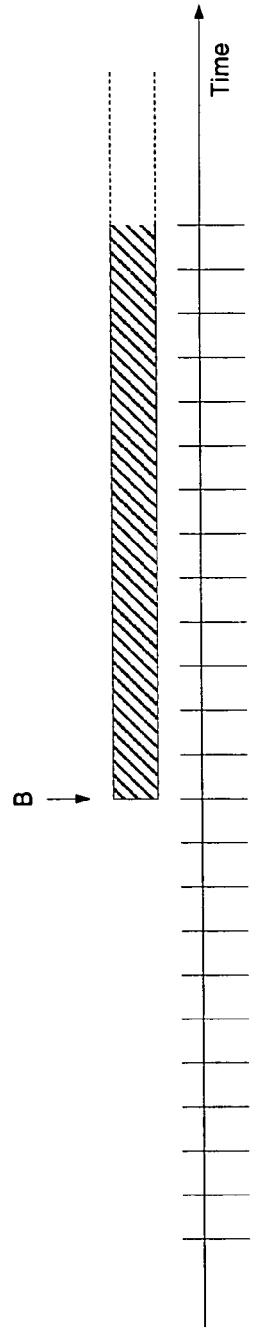

FIG. 3D shows the updated left edge location of the valid data eye to be position B on the relative timeline. The process illustrated in FIGS. 3A-3D details a way to limit the number of incremental timing locations to determine if there is an updated left edge to the valid data eye.

FIGS. 4A-4D illustrate an embodiment of a process to search for the right edge of the valid data eye during operation.

Figure 4A:
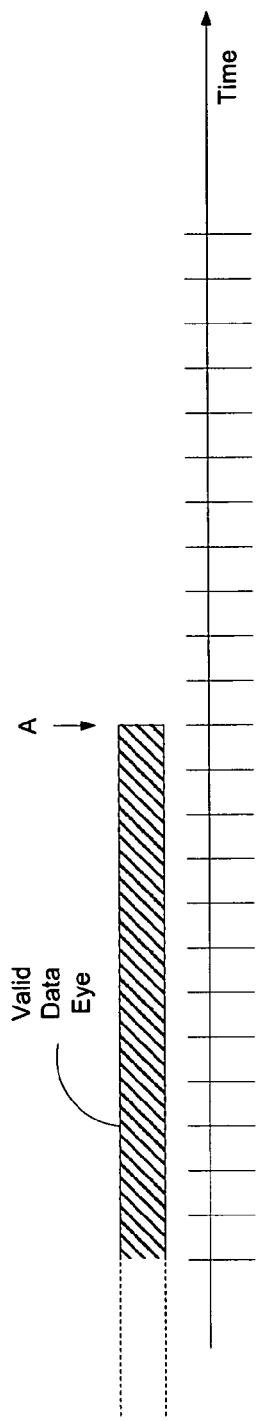
FIGS. 4A-4D illustrate an embodiment of a process to search for the right edge of the valid data eye during operation.

FIG. 4A shows the right edge of a valid data eye along a relative time line where each tick on the timeline accounts for the smallest potential incremental change for data eye edge testing (as well as data strobe positioning). In FIG. 4A, the initial data eye training sequence to find the left and right edges of the eye has been completed and calibration logic has determined that position A is the current right edge. In other words, position A is the furthest right position within the eye where valid data is returned upon issuing a WRTR and/or RDTR (or other read training-type) command. Thus, the next increment to the right of right edge position A in FIG. 4A would return invalid data.

Figure 4B:
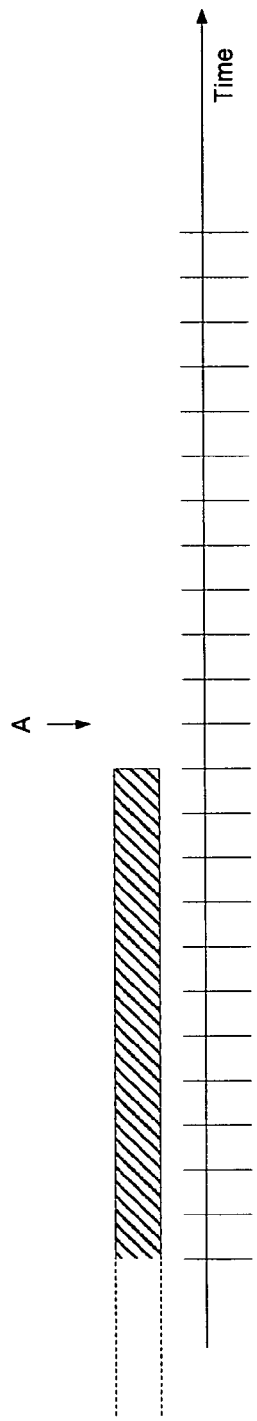

FIG. 4B shows that after a period of operational time, the edge of the valid data eye has moved one increment to the left. Thus, at this point position A is no longer the current right edge of the valid data eye. In fact, position A in FIG. 4B would now return invalid data during testing.

Figure 4C:
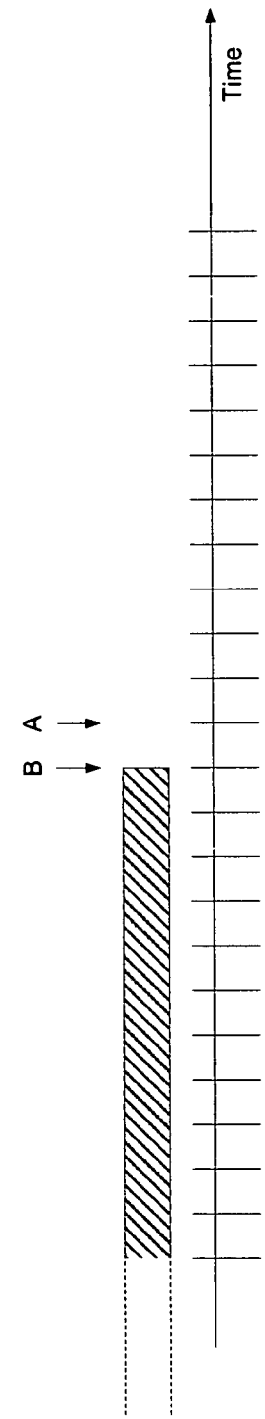

FIG. 4C shows a training sequence issued for position B to determine a new right edge location. In this embodiment, position B does return valid data during a training sequence whereas position A does not, thus position B may be determined to be the new (i.e. updated) right edge of the valid data eye.

Figure 4D:
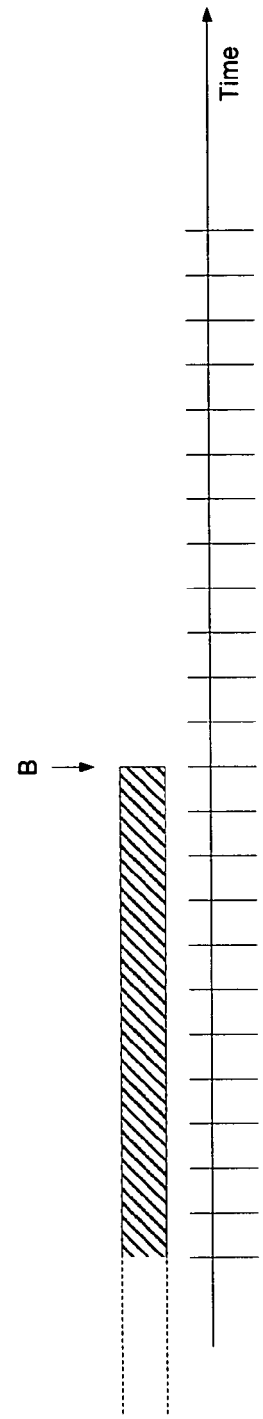

FIG. 4D shows the updated right edge location of the valid data eye to be position B on the relative timeline. The process illustrated in FIGS. 4A-4D details a way to limit the number of incremental timing locations to determine if there is an updated right edge to the valid data eye.

Figure 5:
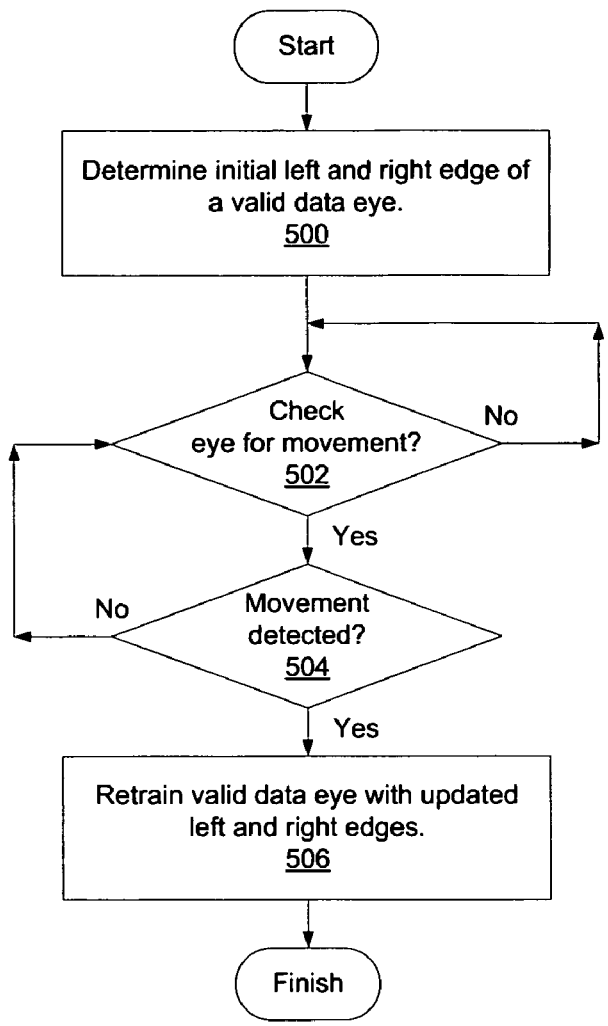
FIG. 5 is a flow diagram of an embodiment of a process to determine the left and right edges of the valid data eye.

FIG. 5 is a flow diagram of an embodiment of a process to determine the left and right edges of the valid data eye.

The process is performed by processing logic that may comprise software, hardware, or a combination of both software and hardware. The process begins by processing logic determining the initial left and right edge of a valid data eye (processing block 500). This may be determined on each byte lane of the interconnect for the initial training sequence.

Next, processing logic at a certain time after the initial training determines that it will check for movement of the valid data eye (processing block 502). The determining factor as to when to check and potentially retrain the valid data eye may vary in different embodiments. For example, the movement checking and retraining sequence may take place after a given amount of time from the previous retraining. In many embodiments, this amount of time may be determined based on how fast eye drift may take place due to a significant change in the workload exerted on one or more memory devices or neighboring devices such as the CPU, GPU or devices, each of which may dissipate heat and cause an increased thermal load. There may be a finite time, for example 100 micro-seconds (μs), below which the temperature of the memory devices will not be capable of changing enough to justify testing for new valid data eye edge locations.

In some embodiments, there may be other events that may trigger a retraining sequence to begin. For example, one or more performance counters may monitor the data throughput in and out of the memory subsystem. If the amount of data over a predetermined period of time exceeds a certain throughput rate (e.g. 1 GB/s), the retraining sequence may be triggered to begin.

In some embodiments, there may be a thermal sensor, power or current sensor coupled to one or more of the memory devices to monitor the temperature and if a large enough temperature gradient exists from a previous retraining point of time, a new retraining sequence may be triggered.

Returning to FIG. 5, if the time has not arrived to check for eye movement, then processing logic returns to block 502. Otherwise, the time to check for eye movement has arrived, then processing logic checks for movement (processing block 504). If movement has not been detected (i.e. processing logic scans immediately around the left and right edge locations and they remain the correct edge locations), then processing logic returns to block 502. Otherwise, if movement has been detected at one or both edges, then processing logic retrains the valid data eye with updated left and right edges (processing block 506) and the process is complete.

In many embodiments, the testing of movement may occur on a single byte lane (e.g. DQ0) on the interconnect if variability in eye drift is found to be insignificant between different byte lanes. Thus, in this embodiment the training may take place for a single byte lane and when the new edges of the eye and the center (the strobe location) are determined for the single byte lane, that incremental timing location information may be applied for each of the other byte lanes as well as the tested byte lane.

In many other embodiments, the testing may occur on each byte lane separately and the new edge and center timing locations may be applied differently per byte lane. In yet other embodiments, the testing may occur on each byte lane and then the results may be averaged across all byte lanes and the new average edge and center locations may be applied to all byte lanes.

Figure 6:
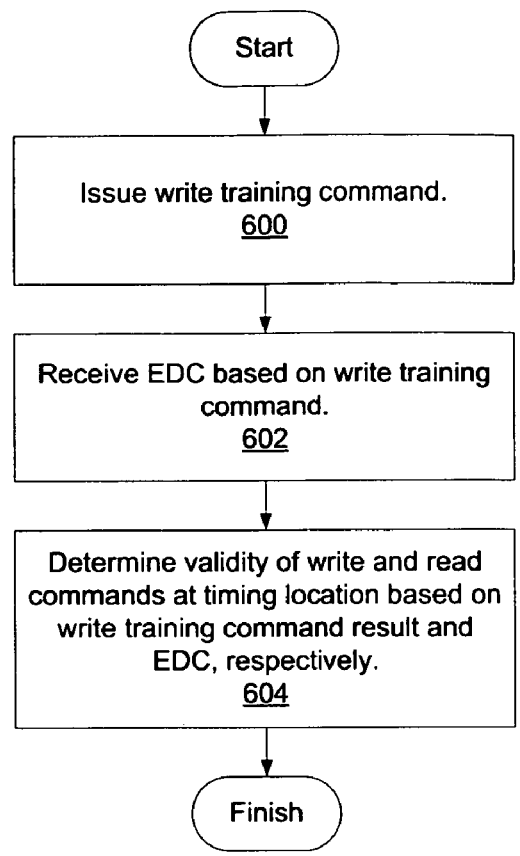
FIG. 6 is a flow diagram of an embodiment of a process to issue training commands at each incremental location that is to be tested for validity of read and write commands.

FIG. 6 is a flow diagram of an embodiment of a process to issue write training commands at each incremental location that is to be tested for validity of read and write commands.

The process is performed by processing logic that may comprise software, hardware, or a combination of both software and hardware. The process begins by processing logic issuing a write training command to the memory (processing block 600). This write training command may be sent to each memory device and on each byte lane. Next, processing logic receives EDC information based on the sent write training command (processing block 602). Finally, processing logic determines, based on the results of the write training command and the received EDC information, whether a write (or read) command issued utilizing the current incremental timing location for the data eye (i.e. if the current timing location was the edge location of the data strobe) would result in correct data. In other words, is the current incremental timing location a valid location within the data eye that produces correct results or an invalid location outside the data eye that produces incorrect results. This completes the process for an individual incremental timing location. This process may be performed at each incremental timing location in a search for the correct edges of the data eye. Additionally, this process may be performed multiple times per incremental timing location for redundancy purposes.

Figure 7:
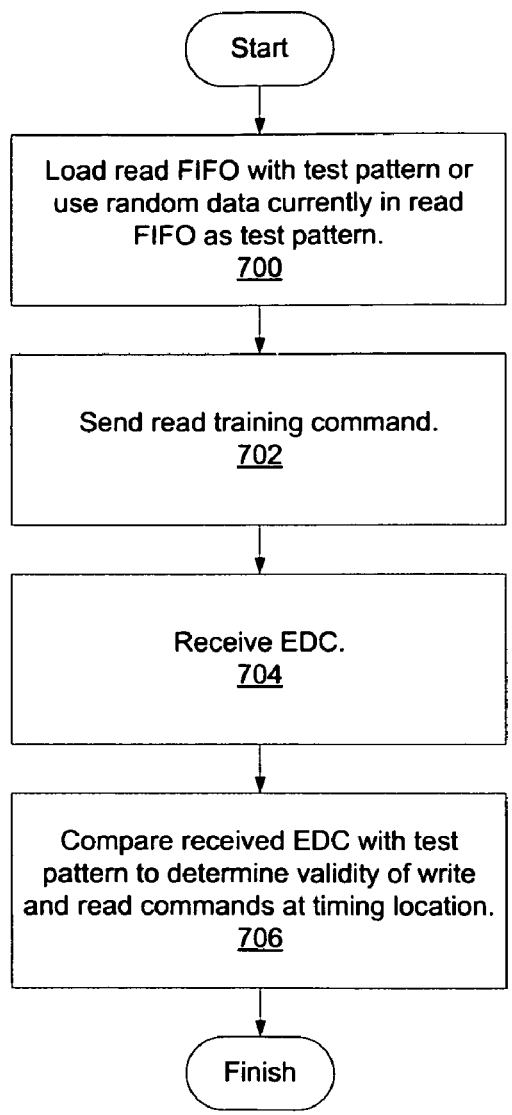
FIG. 7 is a flow diagram of an embodiment of a process to issue read training commands at each incremental location that is to be tested for validity of read and write commands.

FIG. 7 is a flow diagram of an embodiment of a process to issue read training commands at each incremental location that is to be tested for validity of read and write commands.

The process is performed by processing logic that may comprise software, hardware, or a combination of both software and hardware. The process begins by processing logic loading the read FIFO in the memory controller with a test pattern or using the random data currently in the read FIFO as the test pattern (processing block 700).

Next, processing logic issues a read training command to the memory (processing block 702). This read training command may be sent to each memory device and on each byte lane. Next, processing logic receives EDC information based on the sent read training command (processing block 704).

Finally, processing logic determines, based on the results of the read training command and the received EDC information, whether the current incremental timing location a valid location within the data eye that produces correct results for a read (or write) (processing block 706). This completes the process for an individual incremental timing location. This process may be performed at each incremental timing location in a search for the correct edges of the data eye. Additionally, this process may be performed multiple times per incremental timing location for redundancy purposes.

Thus, embodiments of a method, device, and system for fast memory data eye retraining are disclosed. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A method, comprising:
   memory controller calibration logic determining a left edge and right edge of a valid data eye for a memory;
   the memory controller calibration logic periodically checking the left and right edges for movement during operation of the memory;
   the memory controller calibration logic retraining the valid data eye with an updated left edge and right edge when movement is detected;
   the memory controller calibration logic periodically checking the left and right edges further comprises testing each edge location and one or more incremental timing locations left and right of each edge location; and
   for each incremental timing location,
      the memory controller calibration logic sending a write training command to determine validity of a write command in the data eye at the timing location; and
      the memory controller calibration logic receiving a error detecting code (EDC) in response to the write training command, wherein validity of a read command is determined based on whether the EDC is correct.

2. The method of claim 1, further comprising:
   the memory controller calibration logic viewing the data eye on at least one lane of a plurality of lanes of an interconnect coupled to the memory.

3. The method of claim 2, further comprising:
   the memory controller calibration logic retraining the valid data eye for each lane individually based on the determination of the updated left edge and right edge of each lane respectively.

4. The method of claim 2, further comprising:
   the memory controller calibration logic periodically checking the left and right edges of one lane of the plurality of lanes for movement; and
   the memory controller calibration logic retraining the valid data eye with an updated left edge and right edge for each lane when movement is detected on the one lane.

5. The method of claim 2, wherein periodically checking the left and right edges for movement occurs when an amount of data throughput across the interconnect surpasses a predetermined data throughput rate.

6. The method of claim 1, wherein periodically checking the left and right edges for movement repeatedly occurs after a predetermined amount of time elapses since the previous periodic check.

7. The method of claim 1, wherein periodically checking the left and right edges for movement occurs when a memory-related temperature event takes place.

8. The method of claim 1, wherein periodically checking the left and right edges for movement occurs when a memory-related power consumption event takes place.

9. A device, comprising:
   a memory training logic to
      determine a left edge and right edge of a valid data eye for a memory, wherein the data eye is viewed on at least one lane of a plurality of lanes of an interconnect coupled to the memory;
      periodically check the left and right edges for movement during operation of the memory;
      retrain the valid data eye with an updated left edge and right edge when movement is detected;
      test each edge location and one or more incremental timing locations left and right of each edge location to check the left and right edges of the valid data eye for movement;
      for each incremental location,
         send a write training command to determine validity of a write command in the data eye at the timing location; and
         receive a error detecting code (EDC) in response to the write training command, wherein validity of a read command is determined based on whether the EDC is correct.

10. The device of claim 9, wherein the memory training logic is further operable to:
    retrain the valid data eye for each lane individually based on the determination of the updated left edge and right edge of each lane respectively.

11. The device of claim 9, wherein the memory training logic is further operable to:
    periodically check the left and right edges of one lane of the plurality of lanes for movement; and
    retrain the valid data eye with an updated left edge and right edge for each lane when movement is detected on the one lane.

12. A system, comprising:
    a memory interconnect;
    a memory module, coupled to the interconnect, the module including a plurality of memory devices;
    a memory training logic, coupled to the interconnect, the logic to
       determine a left edge and right edge of a valid data eye for at least one of the memory devices, wherein the data eye is viewed on at least one lane of a plurality of lanes of an interconnect coupled to the memory module;
       periodically check the left and right edges for movement during operation of the memory module;
       retrain the valid data eye with an updated left edge and right edge when movement is detected;
       test each edge location and one or more incremental timing locations left and right of each edge location to check the left and right edges of the valid data eye for movement;

for each incremental location, send a write training command to determine validity of a write command in the data eye at the timing location; and receive a error detecting code (EDC) in response to the write training command, wherein validity of a read command is determined based on whether the EDC is correct.

13. The system of claim 12, wherein the memory training logic is further operable to:

retrain the valid data eye for each lane individually based on the determination of the updated left edge and right edge of each lane respectively.

14. The system of claim 12, wherein the memory training logic is further operable to:

periodically check the left and right edges of one lane of the plurality of lanes for movement; and retrain the valid data eye with an updated left edge and right edge for each lane when movement is detected on the one lane.

* * * * *